Sept. 27, 1966 W. V. CHUMAKOV 3,275,856

SEMICONDUCTOR BANK ASSEMBLY

Filed July 31, 1963 5 Sheets-Sheet 1

INVENTOR.
WALTER V. CHUMAKOV

BY

OSTROLENK, FABER, GERB & SOFFEN
ATTORNEYS

INVENTOR.
WALTER V. CHUMAKOV

BY

OSTROLENK, FABER, GERB & SOFFEN
ATTORNEYS

Sept. 27, 1966 W. V. CHUMAKOV 3,275,856

SEMICONDUCTOR BANK ASSEMBLY

Filed July 31, 1963

5 Sheets-Sheet 3

INVENTOR.
WALTER V. CHUMAKOV

BY

OSTROLENK, FABER, GERB & SOFFEN
ATTORNEYS

Sept. 27, 1966 W. V. CHUMAKOV 3,275,856

SEMICONDUCTOR BANK ASSEMBLY

Filed July 31, 1963 5 Sheets-Sheet 4

INVENTOR.
WALTER V. CHUMAKOV

BY

OSTROLENK, FABER, GERB & SOFFEN
ATTORNEYS

Sept. 27, 1966 W. V. CHUMAKOV 3,275,856

SEMICONDUCTOR BANK ASSEMBLY

Filed July 31, 1963 5 Sheets-Sheet 5

INVENTOR.
WALTER V. CHUMAKOV

BY

OSTROLENK, FABER, GERB & SOFFEN
ATTORNEYS 3,275,856

SEMICONDUCTOR BANK ASSEMBLY

Walter V. Chumakov, Philadelphia, Pa., assignor to I-T-E Circuit Breaker Company, Philadelphia, Pa., a corporation of Pennsylvania Filed July 31, 1963, Ser. No. 298,820
6 Claims. (Cl. 307—146)

Figure 1:
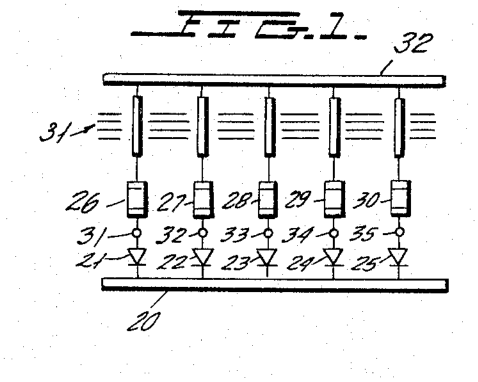

My invention relates to a novel arrangement for a semiconductor bank assembly, and more specifically relates to the provision of a heat sink for both sides of a fuse and its series connected diode wherein current balancing reactor devices are interposed between the two devices.

When forming a high current capacity rectifier system, it is common practice to connect a plurality of semiconductor type diodes in parallel with one another, and to provide suitable balancing reactors to insure the division of current between the parallel connected diodes. Such an arrangement is shown in U.S. Patent No. 2,994,028 issued July 25, 1961, to Dortort, entitled Current Balancing Reactors for Rectifier Elements, and assigned to the assignee of the present invention.

It is also common in such systems to provide a fuse in series with each of the diodes whereby, should the diodes fail, the fuse will operate and thus prevent the short-circuiting of the complete bank of parallel connected elements.

It is common practice to pass a conductor from one of the buses such as the anode bus directly through the current balancing iron and then connect this conductor to one terminal of the fuse. The other terminal of the fuse is then connected to one terminal of the diode and the other terminal of the diode is then directly secured to the cathode bus.

With such arrangements, it has been found that a hot spot is formed at the junction between the fuse and diodes, thus upsetting the calibrated fuse operation and interfering with the characteristics of the diode devices.

The principle of the present invention is to interpose the current balancing structure between the fuses and diodes whereby the fuse has one terminal secured directly to the anode bus, while one terminal of the diode is secured directly to the cathode bus. Thus, sufficient thermal cooling mass is provided for each side of the fuses and diodes, and the previous hot spot will be eliminated.

Accordingly, a primary object of this invention is to provide a novel arrangement for a semiconductor bank assembly wherein heat sinks are provided to cool both sides of the diode and the fuse.

Another object of this invention is to provide a novel arrangement for a semiconductor bank assembly wherein a single anode bus may be arranged over the top of the assembly and cooled by a suitable fluid or cooling fins.

A still further object of this invention is to provide a more economical assembly for a semiconductor bank system.

Yet another object of this invention is to provide a novel semiconductor bank assembly which can utilize barrel-type fuses.

A still further object of this invention is to provide a novel semiconductor bank assembly that has a decreased overall height.

A further object of this invention is to provide a novel semiconductor bank assembly which permits the use of standard fuse pigtail lengths.

A still further object of this invention is to provide a novel semiconductor bank assembly which can be quickly and easily assembled and serviced.

A further object of this invention is to provide a novel semiconductor bank assembly which has improved thermal characteristics.

These and other objects of this invention will become apparent from the following description when taken in connection with the drawings, in which:

FIGURE 1 schematically illustrates the prior art method for arranging the fuses and diodes of a semiconductor bank assembly.

Figure 2:
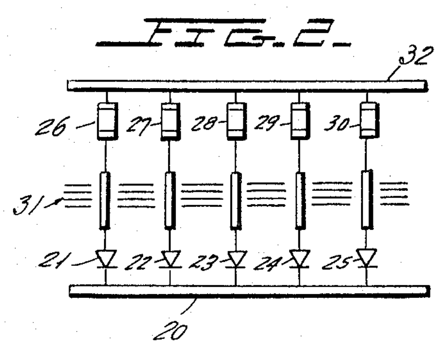

FIGURE 2 schematically illustrates the novel arrangement of the present invention.

Figure 3:
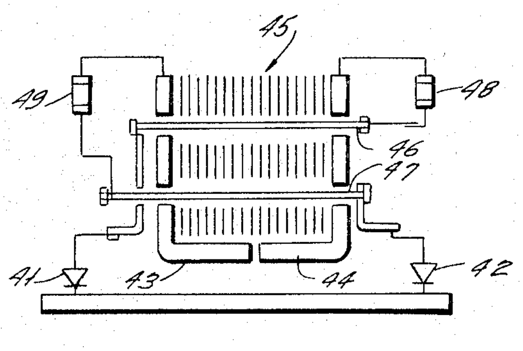

FIGURE 3 schematically illustrates the improved structure of the invention wherein the anode bus is used as a clamping means for carrying current balancing laminations.

Figure 4:
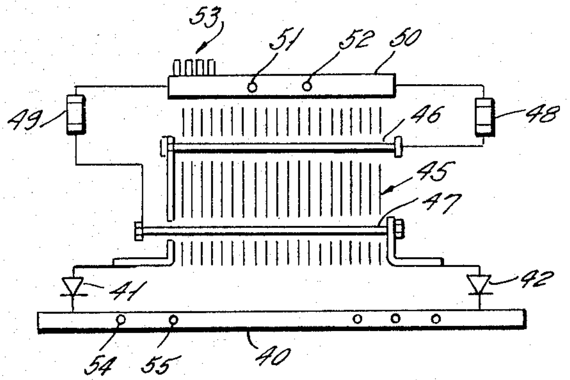

FIGURE 4 schematically illustrates the improved structure of the invention wherein the anode bus is mounted on top of the cathode bus.

Figure 5:
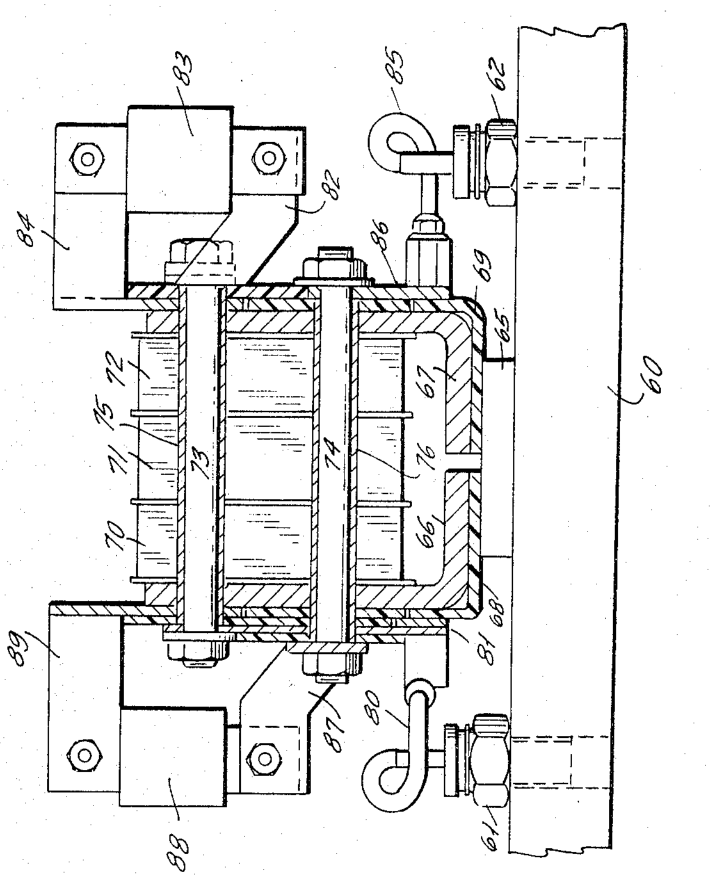

FIGURE 5 is a cross-sectional view of a semiconductor bank assembly constructed in accordance with the invention which utilizes blade-type fuses.

Figure 5A:
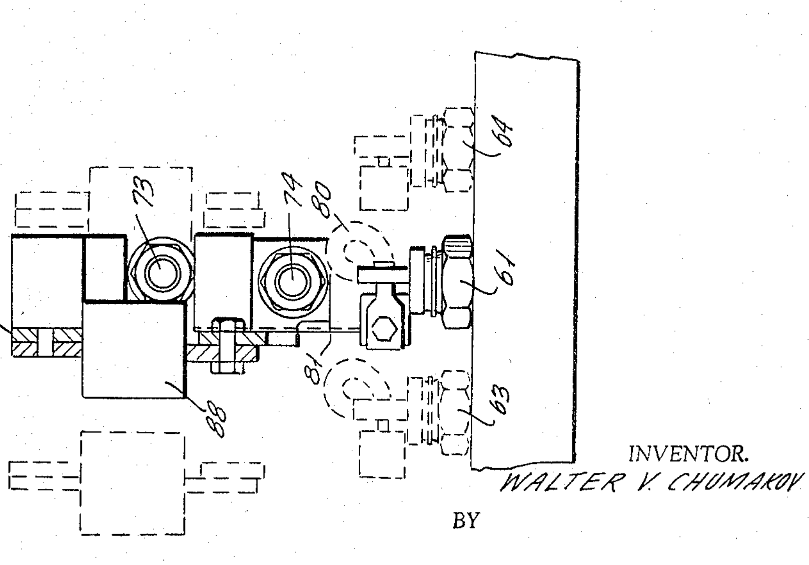

FIGURE 5*a* is a side view of the assembly of FIGURE 5.

Figure 6:
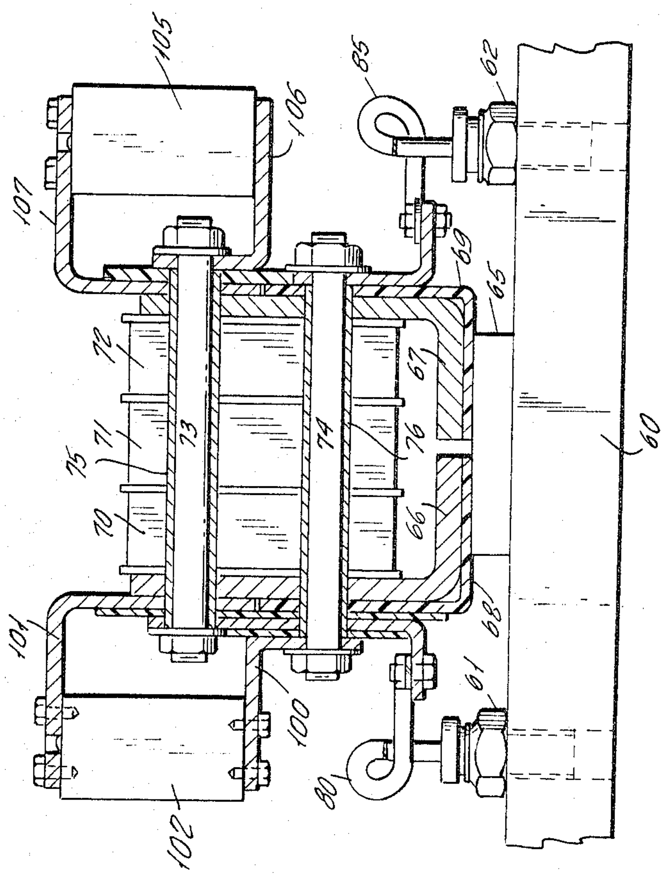

FIGURE 6 is similar to FIGURE 5 and illustrates the manner in which barrel-type fuses may be vertically arranged.

Figure 6A:
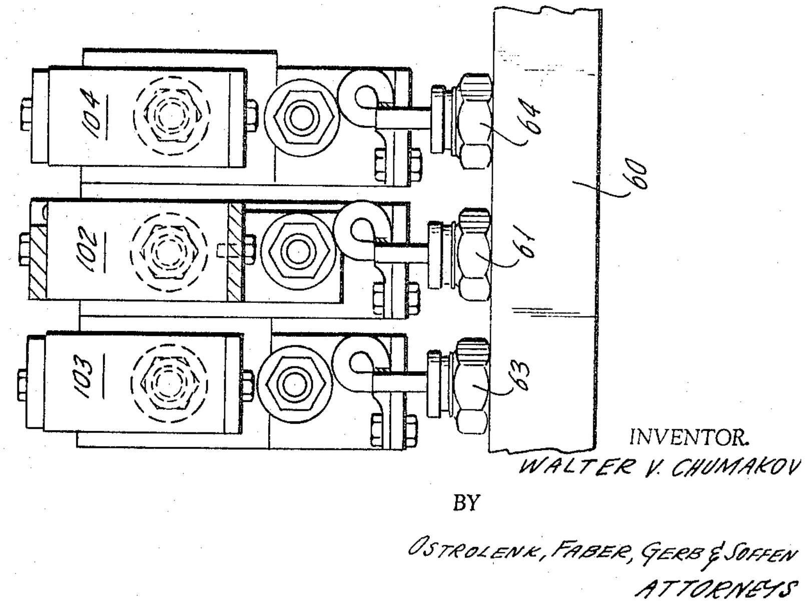

FIGURE 6*a* is a side view of FIGURE 6.

Figure 7:
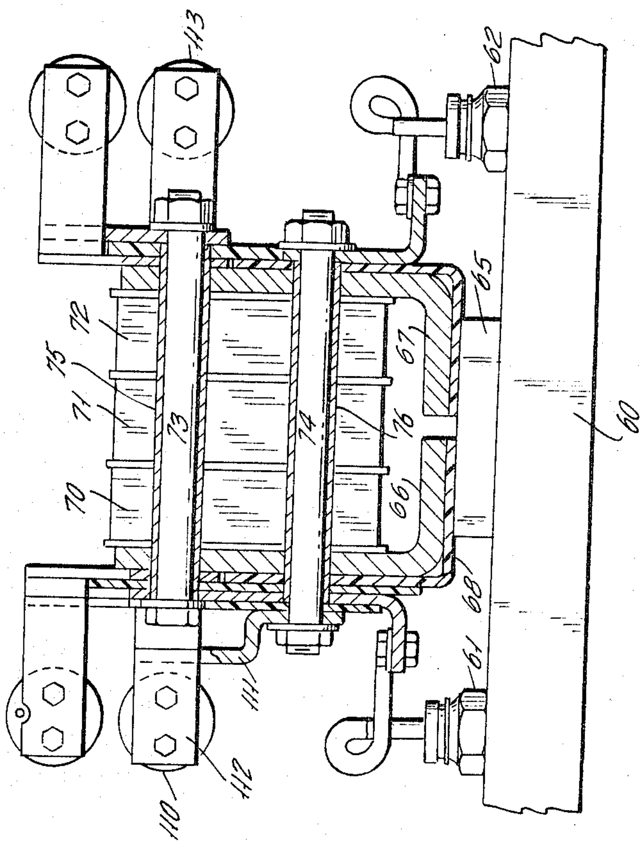

FIGURE 7 is similar to FIGURES 5 and 6, and illustrates the manner in which barrel-type fuses may be horizontally arranged.

Figure 7A:
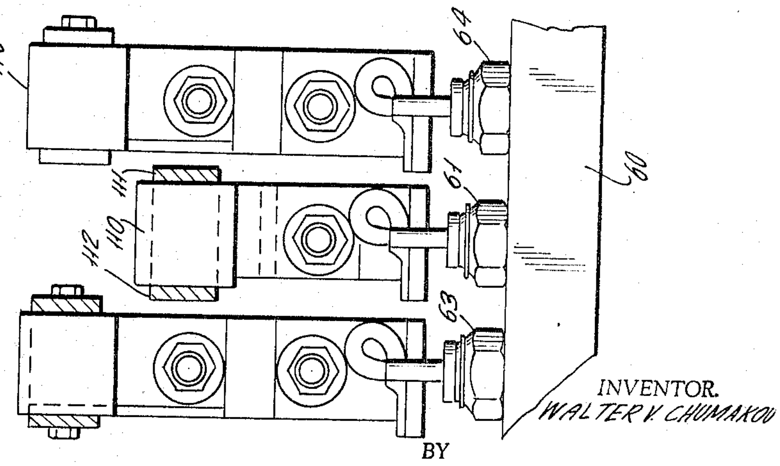

FIGURE 7*a* is a side view of FIGURE 7.

Figure 8:
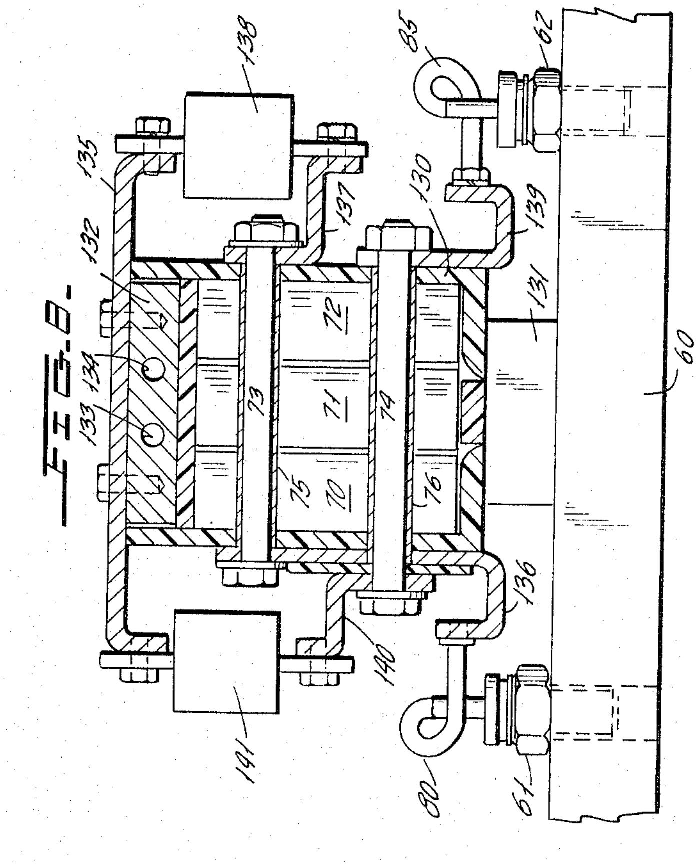

FIGURE 8 is a side cross-sectional view of the semiconductor bank assembly constructed in accordance with the invention wherein the anode bus is arranged on top of the cathode bus in combination with blade-type fuses.

Figure 8A:
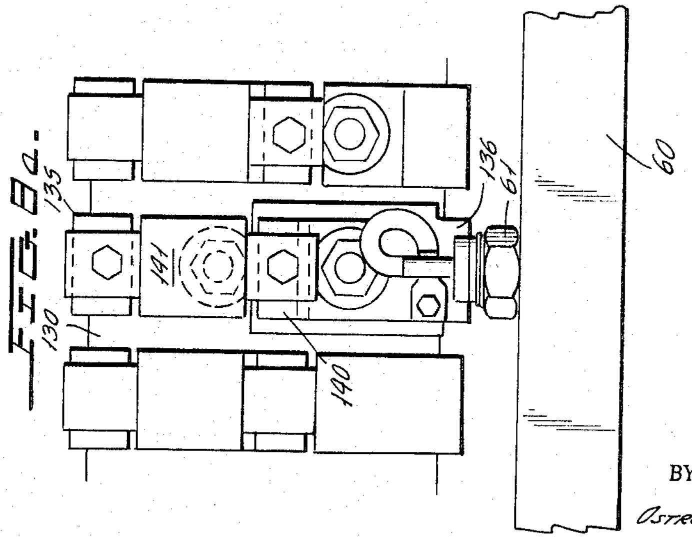

FIGURE 8*a* is a side view of FIGURE 8.

Figure 9:
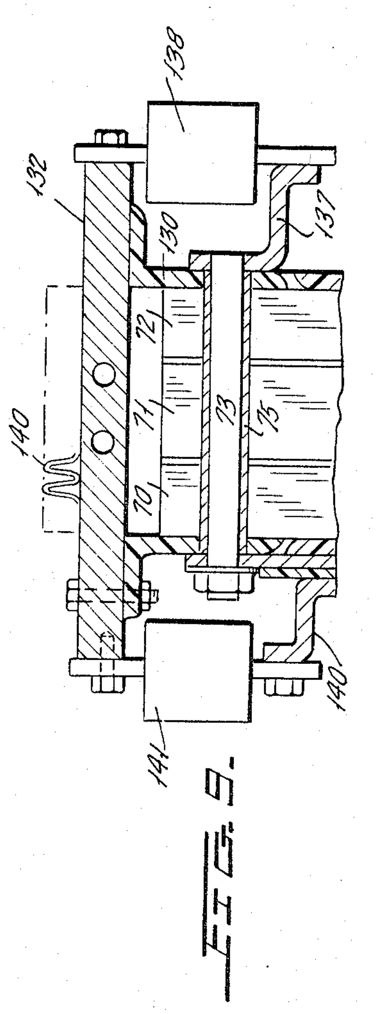

FIGURE 9 illustrates one modification of the arrangement of FIGURE 8 wherein the anode bus extends completely across the system and directly receives the blade of the blade-type fuses.

In general, diodes or any other equivalent semiconductor devices such as silicon controlled rectifiers or transistors which are intended to be included herein under the generic name of diode since they have at least a single junction, are not perfect valves. Thus, they exhibit forward and reverse voltage drops and hence generate heat which should be efficiently removed so that the device characteristics in operation are not impaired and the devices are economically used.

It is a standard practice throughout the industry to connect diode pigtails directly to one terminal of their protective fuse. Since these fuses may have even higher losses than the diodes, such an arrangement has been found to result in poor cooling of the diode-fuse connection. This is detrimental to the diode and causes, for example, increased junction operating temperature. It is also detrimental to the fuse, and causes, for example, changed calibration characteristics.

A typical prior art arrangement is schematically illustrated in FIGURE 1 wherein a main cathode collecting bus 20 has one terminal of diodes 21 through 25 secured thereto. The other terminal of diodes 21 through 25 are then directly connected to one terminal of fuses 26 through 30 respectively, while the other terminals of fuses 26 through 30 pass through the schematically illustrated current balancing reactor iron laminations 31 to terminate on the anode collecting bus 32.

A typical arrangement for the current balancing laminations 31 may be seen in U.S. Patent No. 2,945,961 issued July 19, 1960 to G. A. Healis entitled Current Balancing Reactors for Diodes and assigned to the assignee of the present invention. However, the iron lamination arrangement schematically illustrated in FIGURE 1 could also have been a C-core reactor type arrangement, as shown in U.S. Patent 2,994,028 noted above.

The points 31 through 35 which are the junctions between the fuses and diodes in FIGURE 1 have been found to represent hot spots in the assembly with as much as 50° C. temperature difference measured on some assemblies between points 31 through 35 as compared to points on the upper side of fuses 26 through 30, or at the anode collecting bus 32. This has required improved cooling of the anode bus as well as other portions of the system.

Moreover, and as will be seen more fully hereinafter, the prior art assembly requires a special anode bus structure formed of two copper angles with accurately tapered holes for receiving specially made studs with mating tapered heads to insure good contact with the bus.

The principle of the present invention is illustrated in FIGURE 2 and specifically illustrates a manner of arranging the fuses and diodes which inherently permits improved cooling to take place. Thus, in FIGURE 2 where components similar to those of FIGURE 1 are given similar identifying numerals, the current balancing reactor laminations 31 are interposed between the diodes 21 through 25 and fuses 26 through 30 respectively, whereby both sides of the diodes and fuses are cooled efficiently due to the large mass of collecting buses 28 and 32 on the one side and studs and laminations 31 on their other side. Thus, the previously existing hot spot existing between the fuse and the diode is eliminated.

One manner in which this novel concept may be applied to an anode bus when used with a clamping means is illustrated in FIGURE 3. Referring now to FIGURE 3, I have shown therein a cathode bus 40 which has diodes 41 and 42 terminating thereon. The anode bus is formed of two copper angles 43 and 44 which support the stack 45 of current balancing laminations. Two conductive studs 46 and 47 then extend through the laminations 45 and copper angles 43 and 44 in insulated relationship therewith, whereupon the other terminal of diode 41 is connected to stud 46, while the other terminal of diode 42 is connected to stud 47. The other end of stud 46 is then connected in series with fuse 48, the other terminal of which is directly connected to copper angle 44. In a similar manner, the other end of stud 47 is connected to fuse 49 which, in turn, is connected to copper angle 43.

The net result of the arrangement of FIGURE 3 is that the diode 41 and its series connected fuse 48 have the laminations 45 and stud 46 interposed therebetween to serve as a heat sink for the terminals which are adjacent one another. The opposite, or end terminals, are then directly secured to the cathode bus 40 and anode bus 44 so that these terminals may be suitably cooled. Accordingly, this arrangement prevents the occurrence of the previously existing hot spot shown in FIGURE 1.

As a further advantage of the invention, and as previously indicated, the previous arrangement of FIGURE 1 required the use of the angle-shaped buses 43 and 44 for the anode bus. The present invention, however, frees the designer of this requirement so that he may now utilize a side or top arrangement for the anode bus. Thus, as shown in FIGURE 4 where components similar to those of FIGURE 3 are given similar identifying numerals, the anode bus 50 may now be an overhead, flat bus member which lies atop the stack of laminations 45. The laminations are then supported or appropriately held together by means of the stud 46 and by any other insulation support means desired. Where desired, the anode bus 50 may be provided with channels 51 and 52 which serve to conduct a cooling fluid and can, in addition or alternatively, be provided with suitable cooling fins 53. In a similar manner, the cathode bus 40 may have suitable cooling fluid openings 54 and 55 therein to serve to additionally cool the cathode bus 40.

FIGURE 5 is a more detailed arrangement of the design of FIGURE 3 where the anode buses are used as clamping means for the laminations in connection with a blade-type fuse. More specifically, in FIGURE 5 a cathode bus 60 has diodes 61 and 62 threaded therein. Diodes 61 and 62 are each only one diode of a long line of parallel connected diodes arranged on a cathode bus.

Thus, in FIGURE 5*a*, it is seen that a plurality of additional diodes such as diodes 63 and 64 may be aligned with diode 61.

An insulation spacer block 65 is then placed atop the cathode bus and receives the two copper angles 66 and 67 which form the anode bus. Two L-shaped insulation spacers 68 and 69 extend partially around the anode buses 66 and 67. Three stacks of current balancing laminations 70, 71 and 72 are then carried within the anode buses 66 and 67 by means of the upper stud 73 and lower stud 74 which are surrounded with insulation sleeves 75 and 76 respectively. The pigtail 80 of diode 61 is then electrically connected to a strap 81 which has an insulated opening through which the lower stud 74 passes, and extends upwardly to be electrically connected to the left-hand end of upper stud 73. The right-hand end of stud 73 is then electrically connected to a conductive strap 82 which has the outer end thereof clamped to a blade-type fuse 83. The other end of fuse 83 is then connected to a conductive strap 84 which is, in turn, electrically secured to anode bus portion 67, whereby an electrical circuit is completed from diode 61 through strap 81, stud 73, strap 82, fuse 83, strap 84 and cathode bus 67.

A similar electrical connection is formed for diode 62 which extends from its pigtail 85 through strap 86, stud 74, strap 87, fuse 88, strap 89 and thence to the anode bus section 66.

Accordingly, the novel invention provides a direct heat sink mass for cooling the bottom terminal of diodes 61 and 62 while the pigtails 80 and 85 of diodes 61 and 62 are directly secured to the mass of the current balancing reactor laminations and stud systems 73 and 74 to provide cooling for this side of the diodes. Similarly, the lower terminals of fuses 83 and 88 are cooled by the high thermal mass of the current balancing laminations and their respective conductors, while their other terminals are cooled by their direct securement to the anode buses 66 and 67.

The novel invention further makes it possible, as shown in FIGURES 6 and 6*a*, to easily utilize barrel-type fuses which are vertically arranged. Thus, in FIGURES 6 and 6*a*, wherein components similar to those of FIGURES 5 and 5*a* are given similar identifying numerals, it will be seen that a strap 100 extends from and is electrically connected to the left-hand end of stud 74. A second strap 101 extends from and is electrically connected to anode bus section 66. The two straps 100 and 101 then serve as a support for a barrel-type fuse 102 along with other similar barrel-type fuses 103 and 104 (FIGURE 6*a*).

In a similar manner, the fuse 105 of FIGURE 6, which cooperates with diode 61 is a vertically arranged barrel-type fuse which is carried in support brackets 106 and 107 which are arranged in a manner similar to straps 100 and 101 for the fuse 102 which cooperates with diode 62.

It will be apparent that the barrel-type fuses of FIGURES 6 and 6*a* could also be horizontally arranged, as indicated in FIGURES 7 and 7*a*, where components similar to those of FIGURES 6 and 6*a* are given similar identifying numerals. Thus, in FIGURES 7 and 7*a*, the fuse 110 which cooperates with diode 62 has one terminal secured to conductor strap 111 and its other terminal secured to conductor strap 112, where strap 111 extends from stud 74, while strap 112 extends to conductor 66. Fuse 113, which corresponds to diode 61 is similarly supported.

In order to simplify the mechanical arrangement, alternately arranged fuses and diodes may be staggered in height, as illustrated particularly in FIGURE 7*a*, wherein the fuses associated with the diode adjacent diode 61 and on the other side of the bus are provided with fuses 115 and 116 which are arranged at a higher level than fuse 110.

It should be specifically noted that in the arrangement shown in FIGURES 5, 5*a*, 7 and 7*a*, installation and replacement of the diodes may be accomplished with a standard, straight socket wrench. In the case of the arrangement of FIGURES 6 and 6*a*, a socket wrench with a side handle may be utilized for such installation and replacement.

FIGURES 8 and 8*a* specifically illustrate the manner in which the present invention permits the use of an overhead anode bus. Referring now to FIGURES 8 and 8*a*, I have illustrated therein the cathode bus 60 which carries the diodes 61 and 62. In FIGURES 8 and 8*a*, however, the current balancing laminations 70, 71 and 72 are carried in an installation frame 130 of a suitable insulating material which is, in turn,, supported in the cathode bus by the insulation spacer 131. Studs 73 and 74 then extend through the lamination pack and the sides of the insulation support housing 130 in the usual manner.

The top of insulation housing 130 is provided with a channel which receives the anode bus 132 in an overhead manner. The anode bus 132 may have passages 133 and 134 therein which can conduct a cooling fluid. A U-shaped strap 135 is then connected to the anode bus 132, as shown. The pigtail 80 of diode 61 is then connected directly to a strap 136 which is in turn connected to the left-hand end of stud 73. The right-hand end of stud 73 is connected to strap 137 which is, in turn, connected to the lower terminal of fuse 138. The upper terminal of fuse 138 is connected to the strap 135, as shown.

In a similar manner, the diode 62 is connected to strap 139, stud 74, strap 140 to the fuse 141, and thence to the strap 135 in the anode bus 132.

The novel overhead arrangement of FIGURES 8 and 8*a* permits simplified assembly techniques, and also decreases the height of the assembly. Furthermore, this novel arrangement serves to achieve the desired cooling effect of the invention.

If desired, and as shown in FIGURE 9, the arrangement for the anode bus 132 and housing 130 may be modified so that the anode bus 132 serves as a direct contact plate for the fuses. Thus, the strap 135 of FIGURES 8 and 8*a* is eliminated, and the fuses such as fuses 141 and 138 are directly bolted to the sides of anode bus 132.

Moreover, the anode 132 may be additionally provided with cooling fins schematically illustrated as cooling fins 140.

Although this invention has been described with respect to preferred embodiments thereof, it should be understood that many variations and modifications will now be apparent to those skilled in the art, and it is preferred therefore that the scope of the invention be limited not by the specific disclosure herein but only by the appended claims.

The embodiments of the invention in which an exclusive privilege or property is claimed are defined as follows:

1. In a semiconductor bank assembly; a diode having a first and second terminal, a fuse having a first and second terminal, a current balancing reactor having a conductor winding having a first and second terminal, an anode bus, and a cathode bus; said first terminal of said diode being connected to one of said anode or cathode buses; said second terminal of said diode being connected to said first terminal of said conductor winding, said second terminal of said conductor winding being connected to said first terminal of said fuse, said second terminal of said fuse being connected to the other of said anode or cathode buses.

2. In the device of claim 1; said diode first terminal being a threaded member; said cathode bus having a threaded opening; said threaded member being threaded into engagement with said threaded opening in said cathode bus.

3. In the device of claim 1; said one of said anode or cathode buses having heat exchange means connected thereto.

4. In the device of claim 1; said current balancing reactor including a plurality of laminations having openings therein; said conductor winding including a straight conductive stud extending straight through said openings.

5. A semiconductor bank assembly comprising a plurality of diodes, a plurality of fuses, a current balancing reactor means having a plurality of reactor windings, an anode bus and a cathode bus; each of said plurality of diodes being connected in series with a respective fuse of said plurality of fuses and a respective reactor winding of said plurality of windings; each of said series connected connections of said fuses, diodes and reactor windings terminating on said anode but at one end and said cathode bus at their other end; said reactor windings of each of said series connected fuses, diodes and reactor windings being interposed between their respective fuses and diodes.

6. The device substantially as set forth in claim 5 which further includes cooling means for each of said anode and cathode buses.

References Cited by the Examiner

UNITED STATES PATENTS 3,013,191 12/1961 Connell.

JOHN F. COUCH, *Primary Examiner.*

W. M. SHOOP, *Assistant Examiner.*